United States Patent
Rupp (10) Patent No.: US 6,426,648 B1
(45) Date of Patent: Jul. 30, 2002

(54) CARRY LOOKAHEAD FOR PROGRAMMABLE LOGIC ARRAY

(76) Inventor: Charlé R. Rupp, 17418 Bluejay Ct., Morgan Hill, CA (US) 95037

(*) Notice: Subject to any disclaimer, the term of this patent is extended or adjusted under 35 U.S.C. 154(b) by 0 days.

(21) Appl. No.: 09/550,919

(22) Filed: Apr. 17, 2000

Related U.S. Application Data (60) Provisional application No. 60/174,004, filed on Dec. 30, 1999.

(51) Int. Cl.$^7$ ............................................. H01L 25/00
(52) U.S. Cl. .............................. 326/41; 326/38; 326/39
(58) Field of Search ................................ 326/38, 39, 41

(56) References Cited

U.S. PATENT DOCUMENTS

| | | | |
|---|---|---|---|
| 5,260,611 A | 11/1993 | Cliff et al. | 307/465 |
| 5,274,581 A | 12/1993 | Cliff et al. | 364/784 |
| 5,349,250 A | 9/1994 | New | 307/465 |
| 5,546,018 A | 8/1996 | New et al. | 326/38 |
| 5,629,886 A | 5/1997 | New | 364/787 |
| 5,631,576 A | 5/1997 | Lee et al. | 326/39 |
| 5,672,985 A | 9/1997 | Lee | 326/41 |
| 5,675,262 A | 10/1997 | Duong et al. | 326/41 |
| 5,889,411 A | 3/1999 | Chaudhary | 326/39 |
| 5,898,319 A | * 4/1999 | New | 326/41 |
| 5,926,036 A | 7/1999 | Cliff et al. | 326/40 |
| 5,977,793 A | 11/1999 | Reddy et al. | 326/41 |
| 5,982,195 A | 11/1999 | Cliff et al. | 326/41 |
| 6,140,839 A | * 10/2000 | Kaviani et al. | 326/39 |
| 6,154,053 A | * 11/2000 | New | 326/41 |

FOREIGN PATENT DOCUMENTS

WO      WO 98/51013 A      11/1998

OTHER PUBLICATIONS

Rupp, Charles, "Fast Algorithms for Regular Functions in Field Programmable Gate Arrays," PLD93 Conference Paper, (1993) pp. 1–6.

Hauck, S. et al., "High–Peformance Carry Chains for FPGAs," ACM 6$^{th}$Conf. (Feb. 22–24, 1998) pp. 223–233.

Anonymous: "Binary Adder," IBM Tech. Disclosure Bulletin, vol. 6, No. 4, (Sep. 1, 1963), pp. 39–40.

* cited by examiner

Primary Examiner—Michael Tokar
Assistant Examiner—Anh Tran
(74) Attorney, Agent, or Firm—Cooley Godward LLP (57) ABSTRACT

Carry lookahead techniques are adapted for implementation in a programmable logic device. In one example of the invention, a carry result is computed for a block of function cells, each function cell representing one bit in a multibit operation that uses carry. This carry result is combined with the carry input from a function cell block representing less significant bits in the operation and a carry output is provided to a function cell block representing more significant bits in the operation. The received carry can also be supplied to adjust provisional carry results for each bit associated with the function cells in the block. Accordingly, the received carry input need not be rippled through all the function cells in the block, thus reducing carry propagation delays. This technique is suitable for use in programmable logic devices because only minimal additional logic need be included in each block of function cells (such as the CLBs and LABs in the prior art), and because few, in any, new interconnections between blocks need be introduced.

20 Claims, 12 Drawing Sheets

CARRY LOOKAHEAD FOR PROGRAMMABLE LOGIC ARRAY

This application claims priority Provisional application Ser. No. 60/174,004, filed Dec. 30, 1999.

BACKGROUND OF THE INVENTION

1. Field of the Invention

The present invention relates to programmable logic arrays, and in particular, to structures and techniques for improving carry propagation in programmable logic arrays.

2. Description of the Related Art

Figure 1:
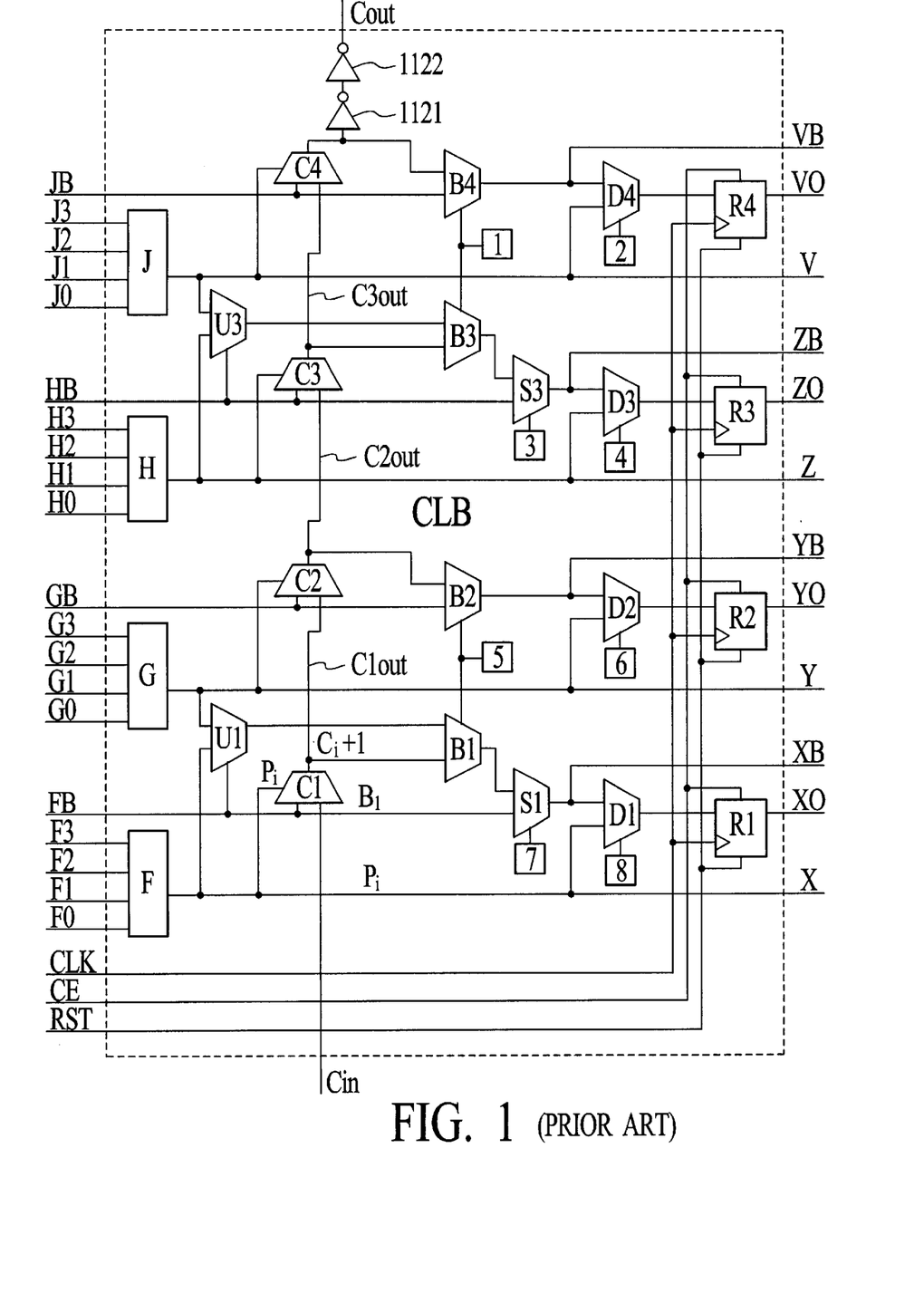
FIG. 1 illustrates the carry technique used in a CLB in a conventional programmable logic device made by Xilinx, Inc.

Techniques for implementing carry propagation in commercially prevalent programmable logic devices (PLDs) or arrays (PLAs) aim at fast carry propagation. FIG. 1 illustrates a configurable logic block (CLB) of a conventional PLD or PLA made by Xilinx, Inc. This CLB is described in more detail in U.S. Pat. No. 5,546,018. As shown, the Xilinx CLB includes four four-input function generator F, G, H, J each comprising lookup tables for implementing one bit of an arithmetic function of two variables which are received on the input terminals 0, 1, 2, 3 of each function generator. Associated with each function generator is a fast carry mux C1, C2, C3, C4. The purpose of these muxes is to propagate carry based on the logical input CIN and the result of the arithmetic function between input variables A and B so as to provide a cumulative carry output signal COUT.

In the conventional PLD described above, for multibit operations of two variables greater than four bits, the carry output signal of one CLB is provided to the carry input of a higher-order CLB in a chain of CLBs depending on the number of bits desired. It should be noted that in the CLB illustrated in FIG. 1, a sum output stage is provided in another CLB for finalizing the sum values using the outputs of the CLB in FIG. 1.

Figure 2:
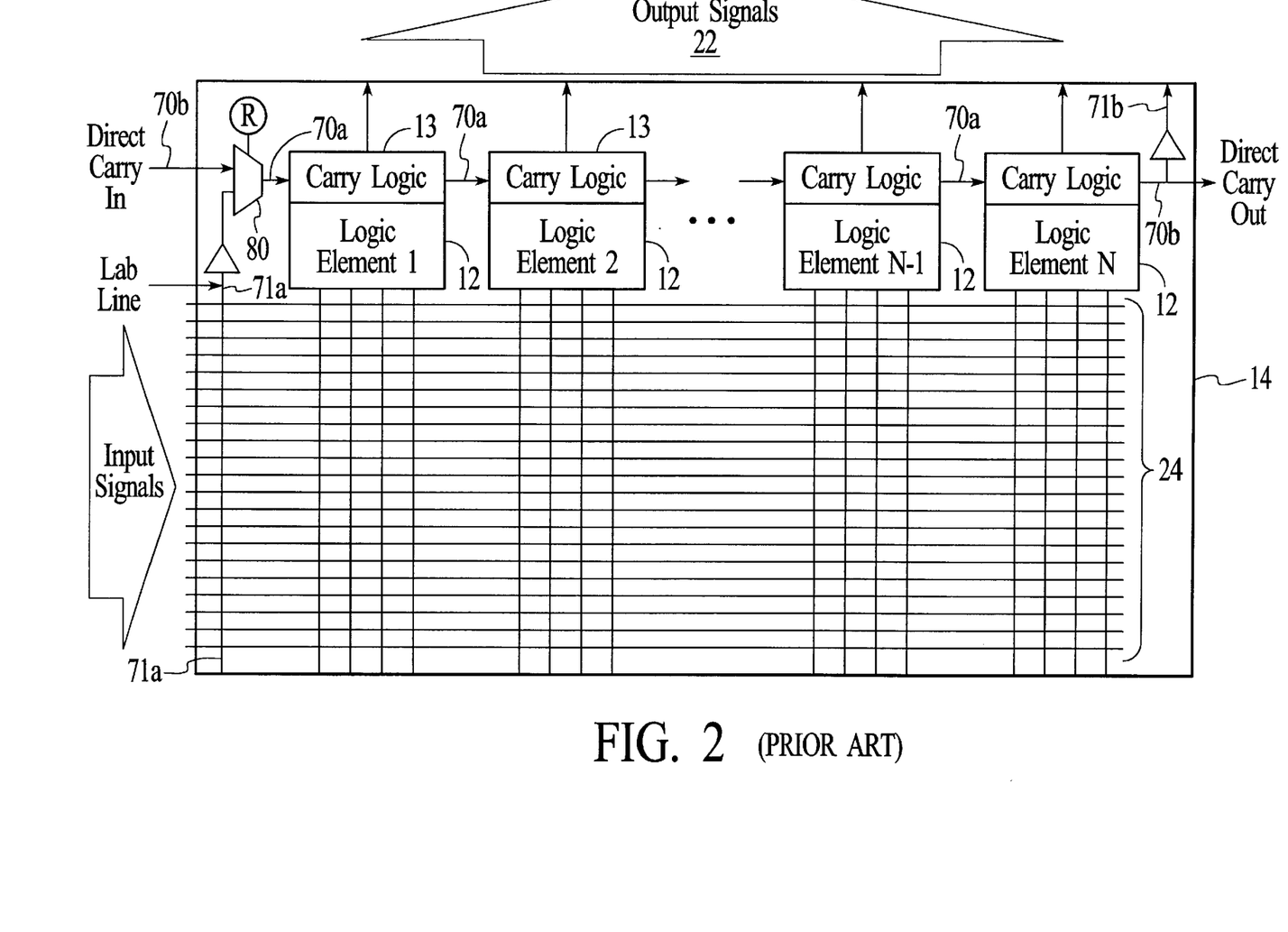
FIG. 2 illustrates the carry technique used in a LAB in a conventional programmable logic device made by Altera, Inc.

FIG. 2 illustrates a logic array block (LAB) of a conventional PLD made by Altera, Inc. This LAB is described in more detail in U.S. Pat. No. 5,761,099. In this device, each logic element 12 (typically eight or ten per LAB) can be configured to perform one bit of an arithmetic operation of two input variables. Each logic element 12 further includes logic 13 for providing a carry output signal based on a carry input and the arithmetic operation of two variables. As shown in FIG. 2, carry is propagated between logic elements along lines 70a in ripple fashion as in the Xilinx device. Lines 70b provide for multibit operations of two variables greater than the number of bits capable of being processed by a single LAB. In such circumstances, the "direct carry out" signal of one LAB is provided to the "direct carry in" signal of a higher-order LAB in a chain of LABs depending on the number of bits desired.

The conventional ripple carry propagation technique described above is slow because the highest order output is not valid until a carry has rippled through all the lower order bits.

Carry lookahead techniques offer the promise of much faster carry propagation than can be achieved with ripple carry techniques. Such techniques have been implemented in digital arithmetic structures for decades (e.g. the 74182 look-ahead carry generator). See, for example, Joseph D. Greenfield, *Practical Digital Design Using ICs*, §14.11 (1983). Some theoretical discussions have addressed considerations for extending such techniques to programmable gate arrays. See, for example, Charle R. Rupp, "Fast Algorithms for Regular Functions in Field Programmable Gate Arrays," Proceedings of the Third Annual PLD Conference (1993). However, prior art structures for performing carry lookahead features require a prohibitive number of elements and complex interconnections therebetween that are not suitable for implementation in a PLD or PLA. Accordingly, carry lookahead techniques have not been seriously considered for use in conventional programmable logic devices.

What is needed in the art, therefore, is an improved carry propagation technique that is suitable for implementation in a programmable logic device. The present invention fulfills this need, among others.

SUMMARY OF THE INVENTION

Accordingly, it is an object of the present invention to overcome the above-described problems in the prior art.

Another object of the invention is to improve the speed of operations in a programmable logic device.

Another object of the invention is to improve the speed of operations that require carry propagation in a programmable logic device.

Another object of the invention is to provide improved performance in a programmable logic device with minimal additional structure.

Another object of the invention is to minimize the number of interconnections required to implement carry propagation techniques in a programmable logic device.

Another object of the invention is to provide a carry lookahead technique that is suitable for implementation in a programmable logic device.

These and other objects are fulfilled by the present invention, in which carry lookahead techniques are adapted for use in a programmable logic device. In one example of the invention, a carry result is computed for a block of function cells, each function cell representing one bit in a multibit operation that uses carry. This carry result is combined with the carry input from a function cell block representing less significant bits in the operation and a carry output is provided to a function cell block representing more significant bits in the operation. The received carry can also be supplied to adjust provisional carry results for each bit associated with the function cells in the block. Accordingly, the received carry input need not be rippled through all the function cells in the block, thus reducing carry propagation delays. This technique is suitable for use in programmable logic devices because only minimal additional logic need be included in each block of function cells (such as the CLBs and LABs in the prior art), and because few, in any, new interconnections between blocks need be introduced.

BRIEF DESCRIPTION OF THE DRAWINGS

These and other objects and advantages of the present invention will become apparent to those skilled in the art after considering the following detailed specification, together with the accompanying drawings wherein.

DETAILED DESCRIPTION OF THE PREFERRED EMBODIMENT

Although the following discussion will focus on multi-bit addition operations, those of skill in the art will understand that the discussion can be easily extended to apply to subtractors, incrementers, decrementers, counters, and acumulators, in addition to other operations that use carry logic.

In arithmetic logic, it is recognized that the sum Y of two single-bit inputs A and B can be expressed by the logical operation:

$$Y = A(XOR)B \qquad (Eq. 1)$$

The present invention builds upon carry lookahead theory in which it is recognized that the carry output bit $C_{out}$ of an arithmetic operation between single-bit inputs A and B and a single-bit carry input $C_{in}$ can be expressed as:

$$C_{out} = (A(AND)B)OR(C_{in}(AND)(A(XOR)B)) \qquad (Eq. 2)$$

From this equation, a single-bit propagate (P) and generate (G) signal are defined in the conventional manner as:

$$P = A(XOR)B \qquad (Eq. 3)$$

$$G = A(AND)B \qquad (Eq. 4)$$

Accordingly, Eq. 1 can be simplified as:

$$C_{out} = G(OR)(C_{in}(AND)P) \qquad (Eq. 5)$$

The above carry lookahead equations can be broken down and re-expressed in many useful ways. Of particular note with respect to the present invention, is that, for a particular bit j in a multibit operation between multibit input words A and B, the carry $C_j$ and sum $Y_j$ can be expressed in terms of same bit j and less-significant bit j−1 values of P and G as:

$$C_j = (C_{j-1}(AND)P_{j-1})(OR)G_{j-1} \qquad (Eq. 6)$$

and $$Y_j = C_j(XOR)P_j \qquad (Eq. 7)$$

Figure 3A:
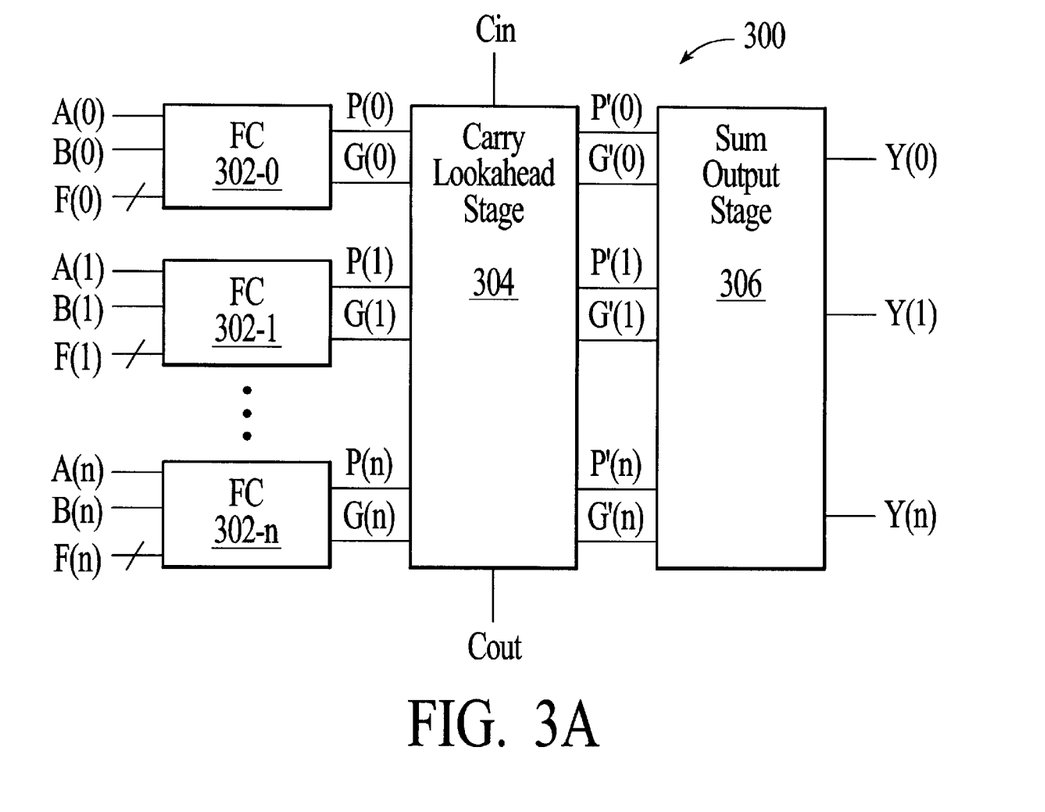
FIG. 3A is a block diagram illustrating an arithmetic logic unit (ALU) in accordance with the present invention.

FIG. 3A is a block diagram illustrating an example implementation of the present invention. As shown in FIG. 3A, a multi-bit operator 300 in a programmable logic array includes a plurality of function cells 302-0 to 302-n, each configured to perform a single-bit operation based on data inputs A and B and function input F, a carry lookahead stage 304 that receives the propagate (P) and generate (G) outputs of each function cell 302, as well as a carry input value $C_{in}$, and provides preliminary sum outputs P' and G' corresponding to each function cell, as well as a carry output value Cout, and a sum output stage 306 that receives the P' and G' preliminary sum outputs corresponding to each function cell and generates final outputs Y based thereon.

For the purposes of the present invention, function cells 302 are preferably those described in U.S. patent application No. 09/475,400, filed Dec. 30, 1999, commonly owned by the assignee of the present invention. However, it should be noted that cells 302 can be conventional programmable elements in programmable logic arrays such as those made by Xilinx, Inc. and Altera, Inc. After being taught by the illustrative examples provided in the present specification, those of skill in the art will understand how such conventional cells and/or groups of such cells such as CLBs or LABs illustrated in FIGS. 1 and 2, may need to be modified to provide appropriate P and G values as outputs or intermediate values rather than, or in addition to, their existing sum and carry outputs.

Figure 3B:
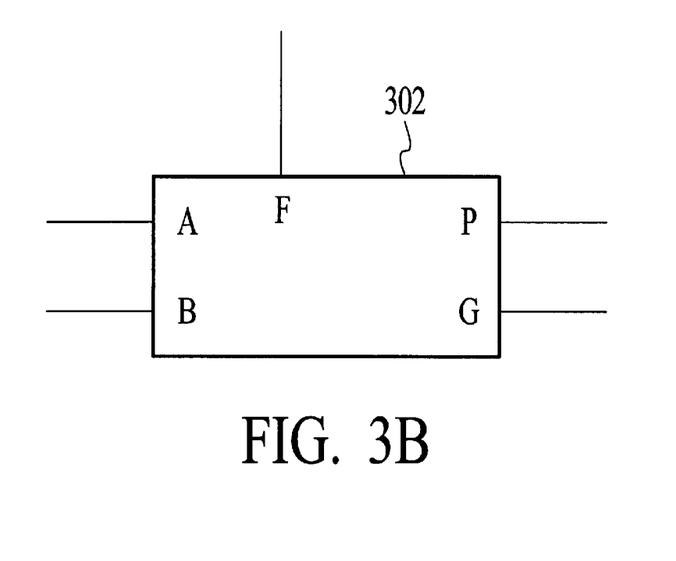
FIG. 3B is a logic symbol of a function cell such as that included in the ALU of FIG. 3A.

In the following figures, function cell 302 will be represented by the logic symbol shown in FIG. 3B. In general, function cell 302 performs a one-bit operation on received one-bit inputs A and B based on the received function input F, and provides output signals based on those inputs. In the example shown in the following figures, the outputs are propagate and generate signals, although this example is illustrative and not limiting.

Various examples of carry lookahead stage 304 and sum output stage 306 in accordance with the principles of the present invention will now be described. Although shown separately for illustration and for clarity of the present invention, it will become apparent to those of skill in the art that in practice, various components of stages 304 and 306 may actually be included within or grouped with function cells 302, and vice versa. The actual collection and division of components between cells 302 and stages 304 and 306 is considered to be a design choice, although preferable examples will be illustrated below for a more complete understanding of different aspects of the present invention.

Figure 4:
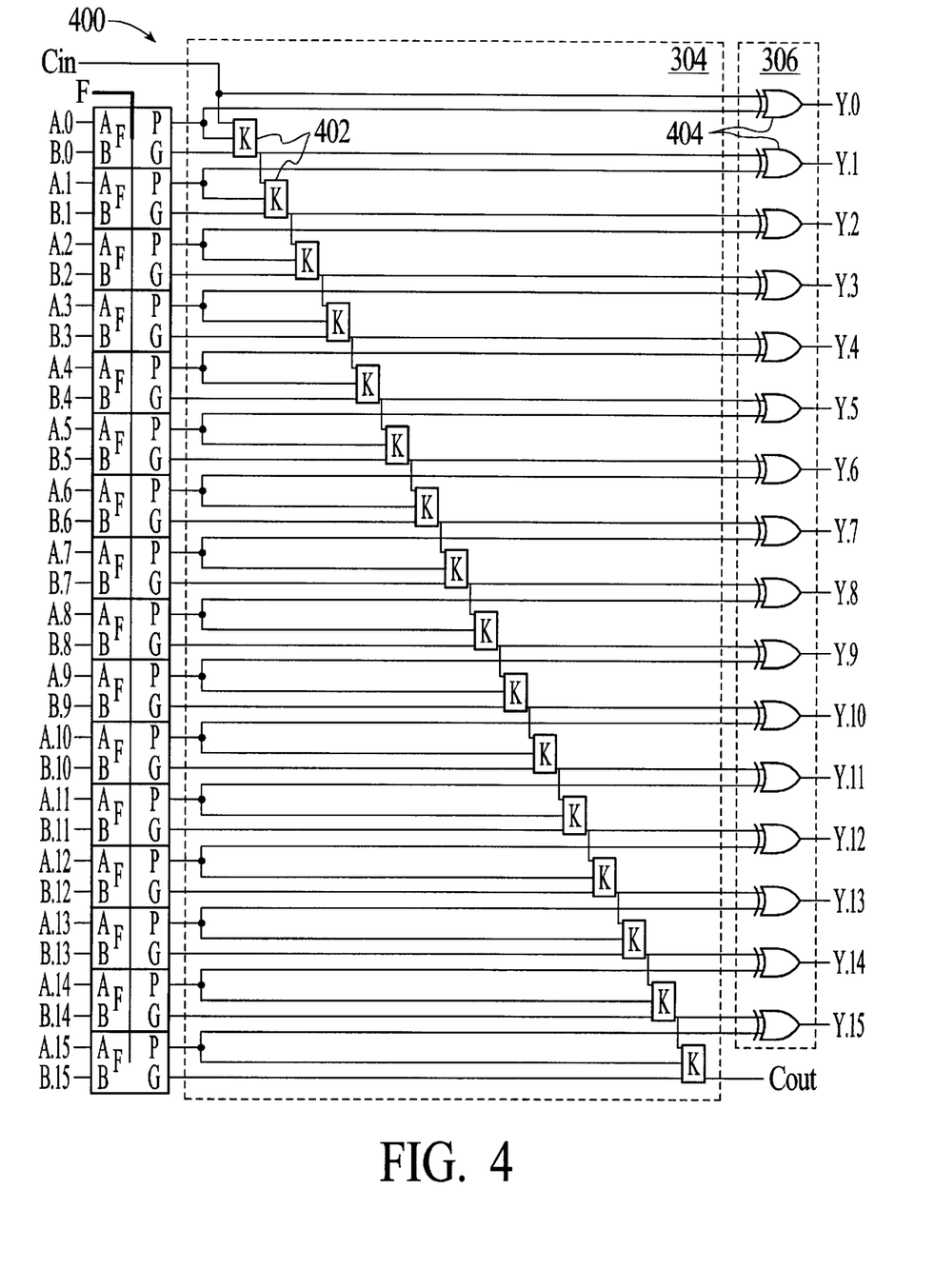
FIG. 4 illustrates an ALU in accordance with an example of the present invention implementing a ripple carry scheme.

FIG. 4 illustrates a first example of a 16-bit ALU circuit 400 in accordance with the invention. As can be seen, in this example of structure 300, carry lookahead stage 304 implements a ripple carry technique wherein K blocks 402 implement Eq. 6 to derive the carry $C_j$ for each bit j from the initial $P_{j-1}$ and $G_{j-1}$ signals from the previous bit j−1 and the carry signal $C_{j-1}$ from bit j−1. As can be further seen, sum output stage 306 includes XOR gates 404 which respectively form the sum $Y_j$ from the carry signal and propagate signal for each bit j in accordance with Eq. 7. The output of K block 402 for each bit is thus used both to provide the carry for the bit for use in deriving the sum for that bit, and for input to deriving the carry for the next significant bit in ripple fashion.

This is the least expensive implementation of structure 300 in terms of number of components required, but results in a worst case propagation time which is directly proportional to the number of bits of the operands. This can be seen in the figure by tracing a change in the value of A0 signal to the final carry output signal $C_{out}$. In this path, the change in the extreme case must traverse each of the sixteen K blocks. Although this carry chain structure suffers from the same carry propagation delays common in the prior art, it is relatively simple to implement in PLDs or PLAs with only minor modification of commercial FPGA products, and so is presented herein for illustration.

Figure 5:
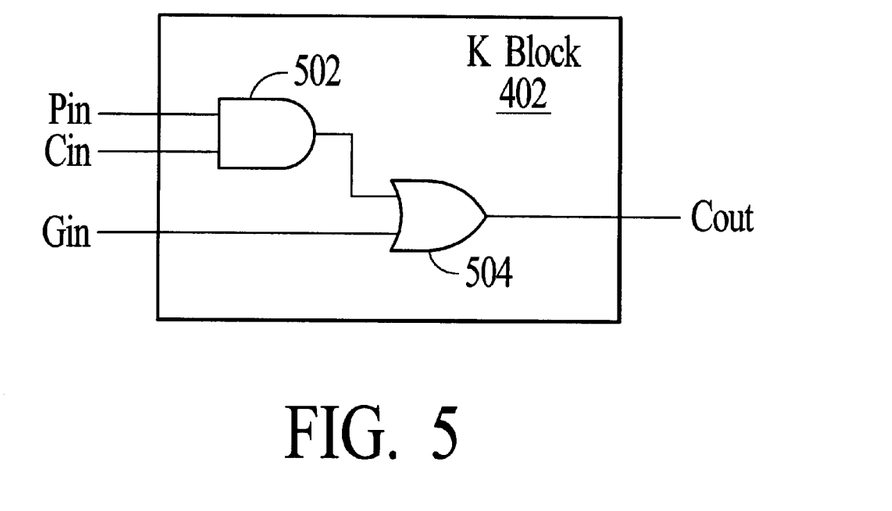
FIG. 5 illustrates a K block such as that can be used to implement the carry equations of the present invention.

FIG. 5 illustrates an example of K block 402 that can be used in the structure 400. As shown in FIG. 5, K block 402 includes AND gate 502 forming the logical AND result of received propagate and carry signals, and OR gate 504 forming the logical OR result of the output of AND gate 502 and the received generate signal. As explained above, K block 402 can be readily adapted for use in implementing carry lookahead Eq. 6.

Figure 6:
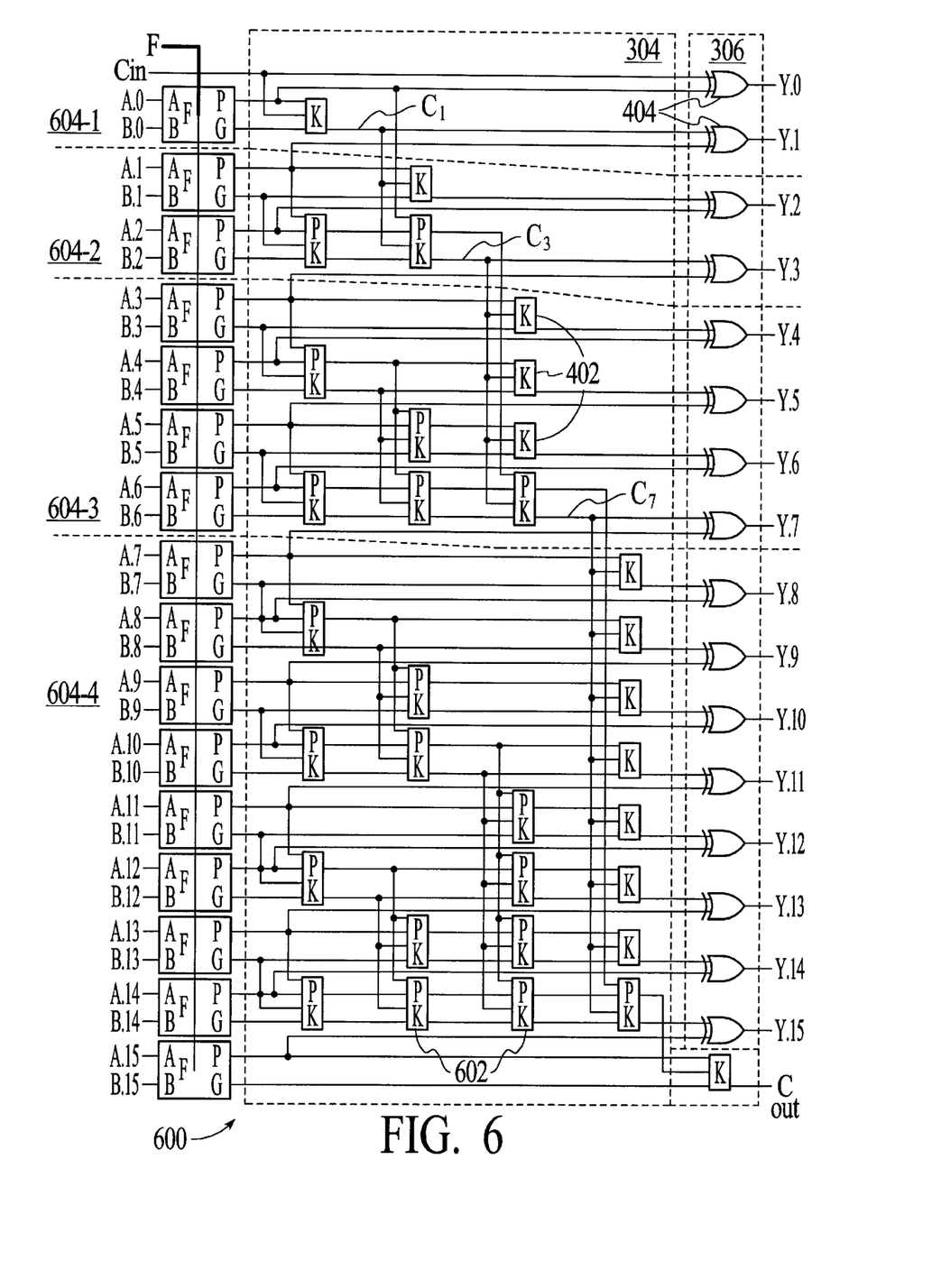
FIG. 6 illustrates an ALU in accordance with another example of the present invention implementing a minimum delay balanced tree carry scheme.

A "minimum delay balanced tree" structure 600 for implementing a 16-bit ALU in accordance with the present invention is illustrated in FIG. 6. As can be seen, in this alternative implementation of structure 300, carry lookahead stage 304 includes thirteen K blocks 402 and twenty PK blocks 602 that are arranged and interconnected for simultaneously propagating carry and forming P and G outputs for sum output stage 304, which includes XOR gates 404 for each bit as in the previous example.

The carry lookahead stage 304 in structure 600 implements a "fan-out" technique whereby carry results from a k-th stage are fanned out to the carry determination blocks for the next $2^k$ significant bits. For example, as shown in FIG. 6, the carry result from the K block in stage 604-1 that determines carry for bit 1 is fed to the K block and PK block in stage 604-2 for determining the carry for bits 2 and 3. Likewise, the carry result from the PK block in stage 604-2 is fed to the three K blocks and one PK block in stage 604-3 that determine the carry for bits 4, 5, 6 and 7.

This technique results from recalling from Eq. 6 that, in general:

$$C_j = (C_{j-1}(AND)P_{j-1})(OR)G_{j-1} \quad (Eq. 6)$$

Accordingly, it immediately follows that:

$$C_{j-1} = (C_{j-2}(AND)P_{j-2})(OR)G_{j-2} \quad (Eq. 8)$$

and by substitution of Eq. 8 back into Eq. 6:

$$C_j = ((C_{j-2}(AND)P_{j-2})(OR)G_{j-2})(AND)P_{j-1})(OR)G_{j-1} \quad (Eq. 9)$$

It should be apparent that this substitution process can be performed iteratively to determine carry for any bit j based on any known carry from a prior bit j−x and all intervening x P and G values, that is:

$$C_j = f(C_{j-x}, P_{j-1} \ldots P_{j-x}, G_{j-1} \ldots G_{j-x}) \quad (Eq. 10)$$

It should be further apparent that logical combinations of input values A and B can be substituted for equivalent values of P and G and C in various ways to arrive at the same final carry value.

An important feature of Eqs. 9 and 10, and uniquely applied in the present invention, is that the carry for each intervening bit between $C_j$ and $C_{j-x}$ need not be expressly calculated before determining the desired carry value.

Figure 7:
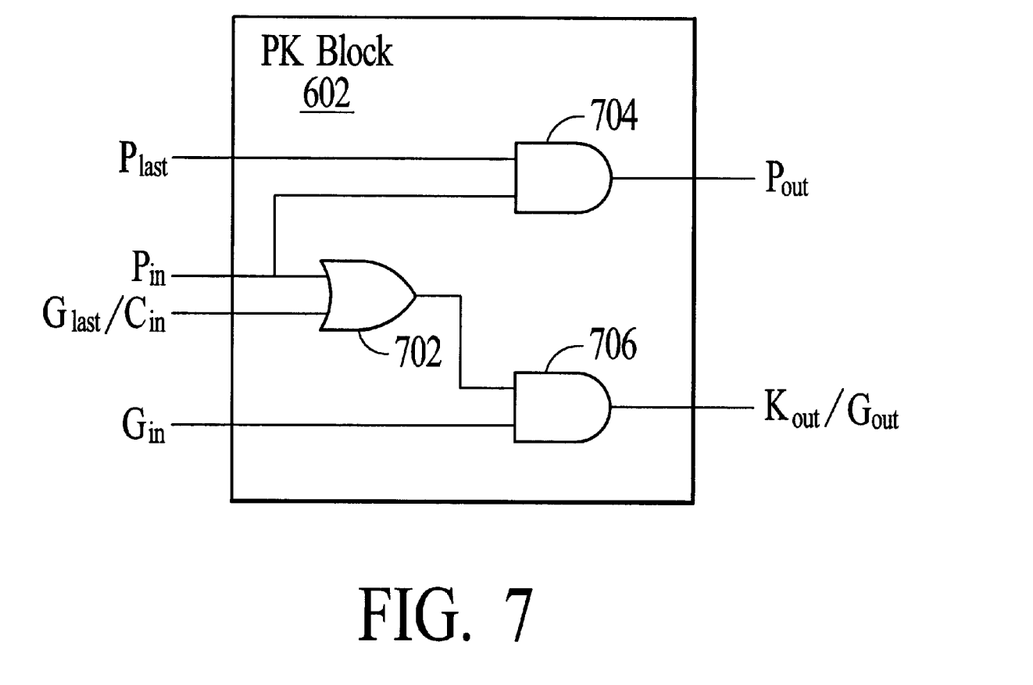
FIG. 7 illustrates a PK block such as that can be used to implement the carry equations of the present invention.

FIG. 7 illustrates an example of PK block 602 having an OR gate 702 forming the logical OR result of received propagate and carry/generate signals, AND gate 704 forming the logical AND result of the propagate signals from the current and previous stages, and AND gate 706 forming the logical AND result of the output of OR gate 702 and the received generate signal. As seen in FIG. 7, PK block 602, alone or cascaded with other PK blocks and/or K blocks 402 depending on the number of intervening propagate and generate values required, is useful for implementing Eqs. 9 and 10.

Although this type of structure achieves minimal carry propagation delay, the cost to implement it in terms of number of components required is prohibitive for most general purpose programmable logic arrays. Furthermore, the irregular nature of the interconnections deteriorates the performance and makes it difficult to define a regular pattern for tiling the programmable structure.

Figure 8:
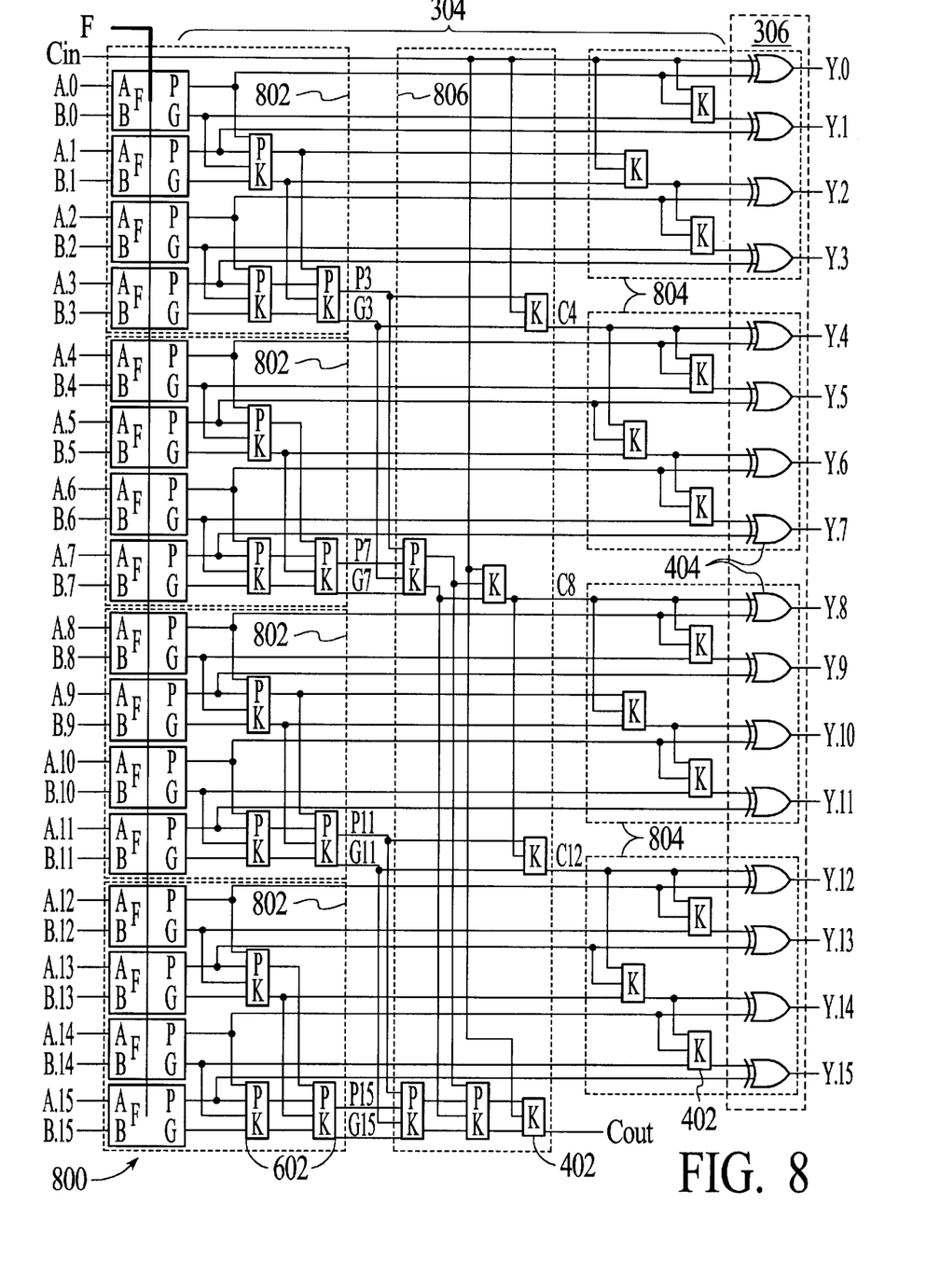
FIG. 8 illustrates an ALU in accordance with another example of the present invention implementing a pyramid carry scheme.

A variation of the balanced tree principle is called the "pyramid structure," a 16-bit ALU example implementation of which is illustrated in FIG. 8. As shown in FIG. 8, carry lookahead stage 304 of structure 800 includes fifteen PK blocks 602 and sixteen K blocks 402 that are arranged for simultaneously propagating carry and forming P and G outputs for sum output stage 304, which includes XOR gates 404 for each bit as in the previous examples.

This is a variation of the fan-out technique described above. However, rather than fanning out intermediate carry results as much as possible, only the intermediate carry result of one set of four bits is supplied to the next higher order set of four bits. Intermediate PK blocks are then used to collect propagate and generate signals from each set of four bits and supply them to the next set of four bits.

Figure 9A:
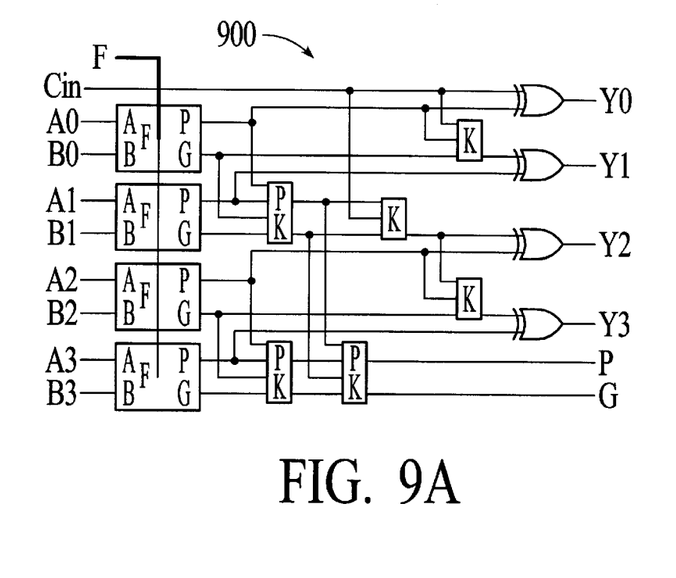
FIGS. 9A and 9B illustrate a CLA block that results from a decomposition of part of the structure in FIG. 8.
Figure 9B:
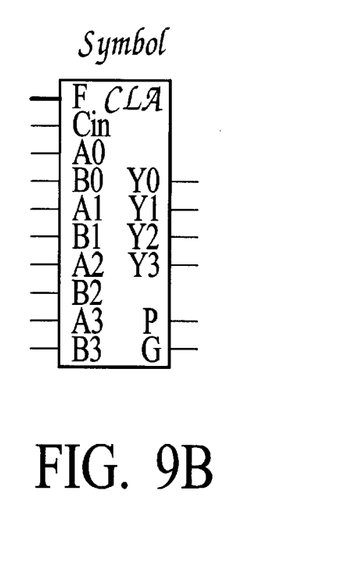

The worst case carry propagation delay of this circuit is about twice that of the previous case. Although highly irregular, this structure has a very useful decomposition property by noting that all of the blocks labeled 802 in the circuit are the same. Similarly, all of the blocks labeled 804 are the same. By combining each logic block of type 802 on the left with a corresponding logic block of type 804 on the right, a simpler form is achieved that allows the construction of a more complex circuit. This simpler logic circuit 900 and its corresponding block diagram symbol are shown in FIGS. 9A and 9B.

Figure 10A:
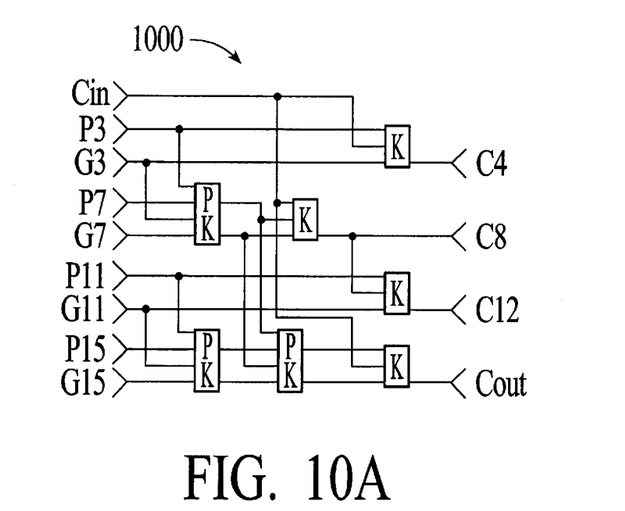
FIGS. 10A and 10B illustrate a CLU block that results from a decomposition of remaining parts of the structure in FIG. 8.
Figure 10B:
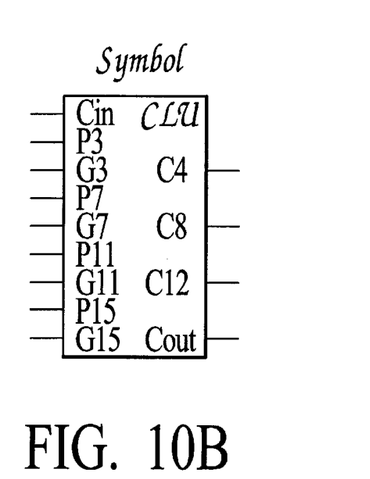
Figure 11:
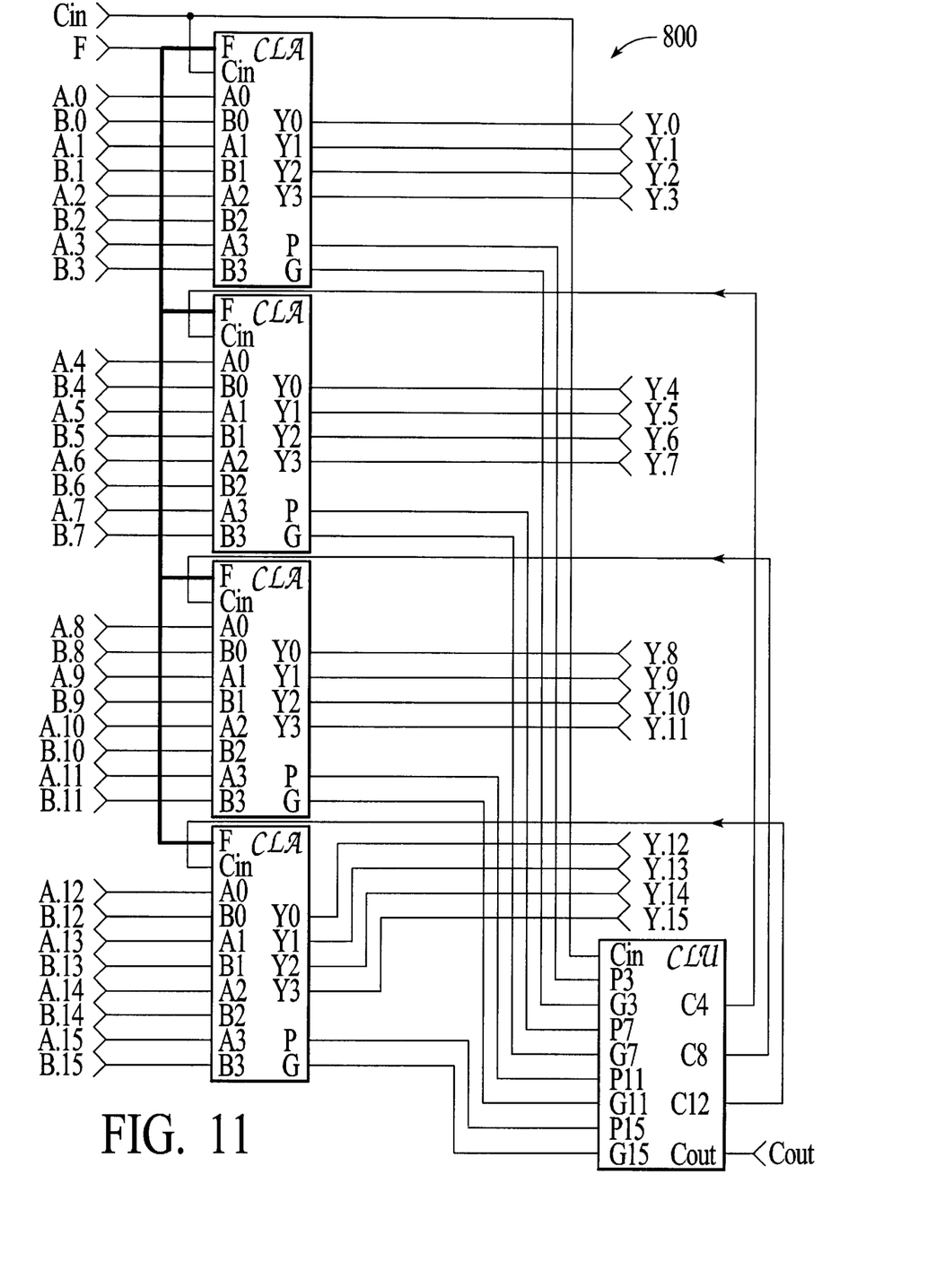
FIG. 11 illustrates how the blocks identified in FIGS. 9 and 10 can be interconnected to implement the ALU illustrated in FIG. 8.

The remaining circuitry of the original 16-bit structure (the logic circuit box labeled 806 in the figure) is then collected and forms the Carry Lookahead Unit (CLU) 1000 as shown in FIG. 10A, and its corresponding block diagram symbol is shown in FIG. 10B. FIG. 11 then shows the construction of 16-bit ALU 800 using these 4-bit blocks. This is essentially the same interconnection of signals used to construct a 16-bit ALU using the '74181 and '74182 circuits. Larger ALUs can then be constructed by forming larger trees using these building blocks.

Although this form of carry propagation is popular in the design of computers due to its relatively low cost and significant performance improvement compared to the ripple structure, it is undesirable for the construction of a regular programmable logic array since the wiring and placement of the K and PK blocks is highly irregular.

Figure 12:
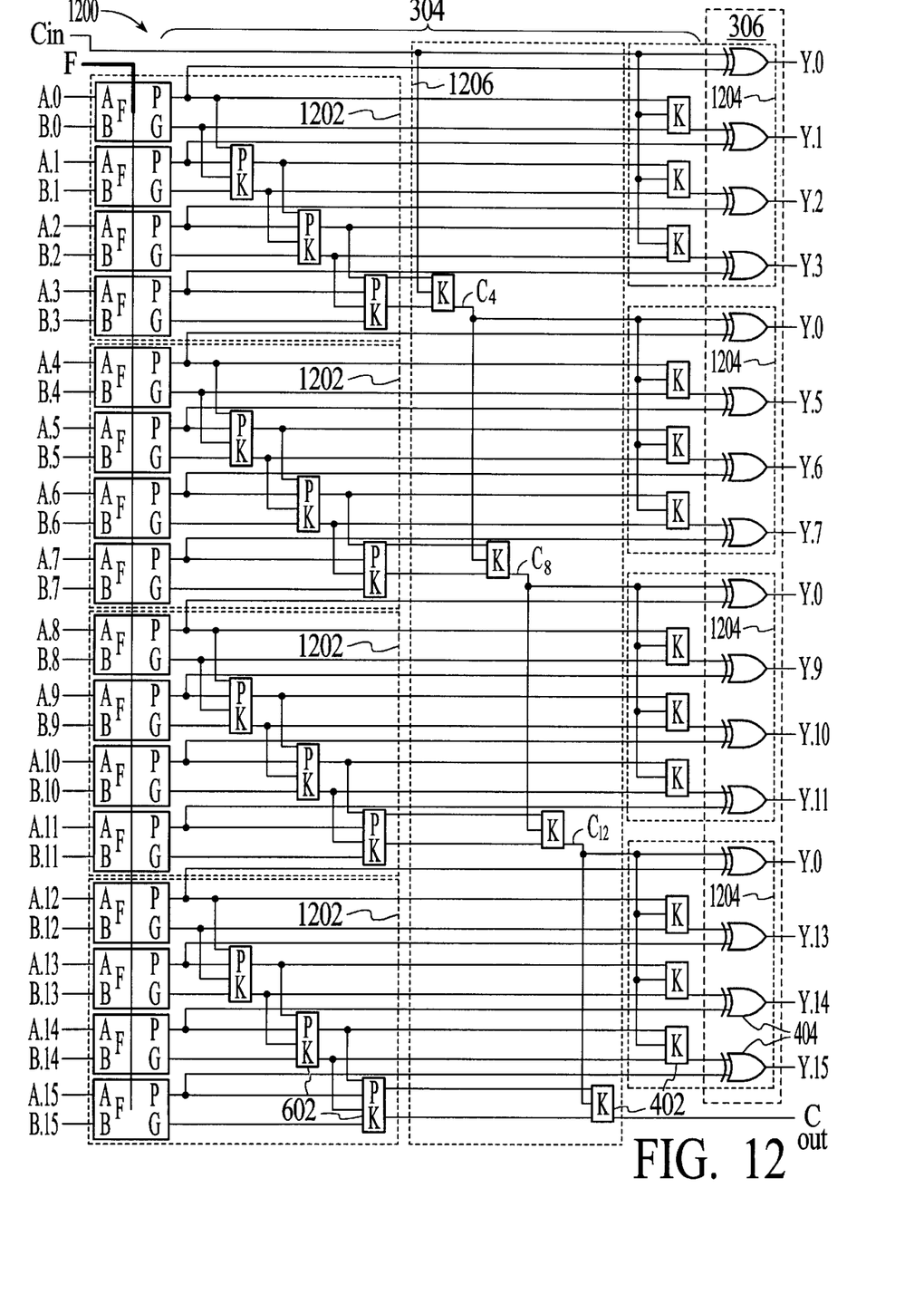
FIG. 12 illustrates an ALU in accordance with a preferred example of the present invention implementing a carry lookahead scheme that is readily adaptable to programmable logic devices.

FIG. 12 illustrates yet another example implementation of a 16-bit ALU structure 1200 in accordance with the present invention. As shown in FIG. 12, carry lookahead stage 304 of structure 1200 includes twelve PK blocks 602 and sixteen K blocks 402 that are connected and arranged for simultaneously propagating carry and forming sum and carry precedent outputs for sum output stage 304, which includes XOR gates 404 for forming the sum output from the propagate and carry signals for each bit as in the previous examples.

As in the immediately preceding example implementation of structure 300, due to the similarity of arrangement and interconnections, useful decomposition properties are apparent. For example, the 16-bit ALU structure can be broken up into identical 4-bit ALU blocks 1202, four identical increment adjustment blocks 1204, and an intermediate carry block 1206. In this example shown in FIG. 12, each ALU block 1202 and increment adjustment block processes four bits for illustration, but it should be noted that the principles of the invention can be extended to other numbers of bits. For example, if each ALU block 1202 processed eight bits, the chain of PK blocks would be extended to a length of seven rather than three, the intermediate carry block 1206 would only include two K blocks, and each increment adjustment block 1204 would include seven K blocks rather than three. It should be apparent that a multiplexer could be provided between chains of K blocks and increment adjustment block 1204 to allow for dynamic selection between different ALU block sizes. It should be further apparent that each ALU block need not process the same number of bits.

As shown in FIG. 12, for each 4-bit ALU block 1202, cumulative propagate and generate signals are formed by a short ripple pattern using PK blocks 602. The outputs of the final PK block are fed to intermediate carry block 1206 and combined with the carry output from the previous 4-bit stage to form an intermediate carry out signal using a single K type logic block 402 (i.e. an intermediate carry calculator). The K block in intermediate carry block 1206 and the preceding three PK blocks thus implement a four-bit iteration of Eq. 9 to generate a true intermediate carry output for each four bits (i.e. $C_4$, $C_8$, $C_{12}$ and $C_{out}$).

In addition to propagating them forward to the next K block in intermediate carry block 1206 for use in determining the next intermediate four-bit carry result, the K blocks in intermediate carry block 1206 distribute the true intermediate carry out signals to the increment adjustment block 1204 for use in determining the sum output associated with each bit in the next most significant block as will be explained below.

As shown in FIG. 12, for the least significant bit in increment adjustment block 1204, output Y can be simply determined from the XOR operation between the received carry input and the P output from the function cell 302 associated with that bit in ALU block 1202 in accordance with Eq. 7. For the next most significant bit, the associated K block receives the P and G outputs from the function cell 302 associated with the next least significant bit in ALU block 1202, and the received carry input, and computes the carry for that bit in accordance with Eq. 6 for logical XOR combination with the P signal for that bit in accordance with Eq. 7. For more significant bits, associated K blocks receive the carry input and outputs from associated PK blocks in ALU block 1202, and thus they together implement iterations of Eq. 9 to determine carry for XOR combination with the P signal for the bit. In essence, the carry for each bit is provisionally computed in ALU block 1202 based on an assumption that the input carry is zero (because the output propagate and generate values from block 1202 are not a function of the carry input to the block), and this assumption is corrected in increment adjustment block 1204 for each bit based on the actual received carry.

It should be noted that, unlike the previous examples, the highly regular form of this carry chain circuit is very suitable to the construction of high speed programmable logic array devices.

For example, it is only necessary to add structure to compute and propagate the intermediate carries (as performed by K blocks in intermediate carry block 1206) to each CLB or LAB of the devices shown in FIGS. 1 and 2, respectively. Appropriate configuration switches that specify whether the CLB or LAB is the starting point for an ALU chain may also need to be added as well.

It should be further noted that this carry propagation can yield dramatic improvements in computation speed. That is, rather than requiring the carry input for each CLB or LAB to ripple through each logic element in a chain of CLBs or LABs forming the multibit operator, a received carry input for the CLB or LAB can just be combined with the carry for that CLB or LAB and propagated to the next CLB or LAB in the chain. Moreover, the propagation of carry between CLBs or LABs can use existing interconnections.

Figure 13:
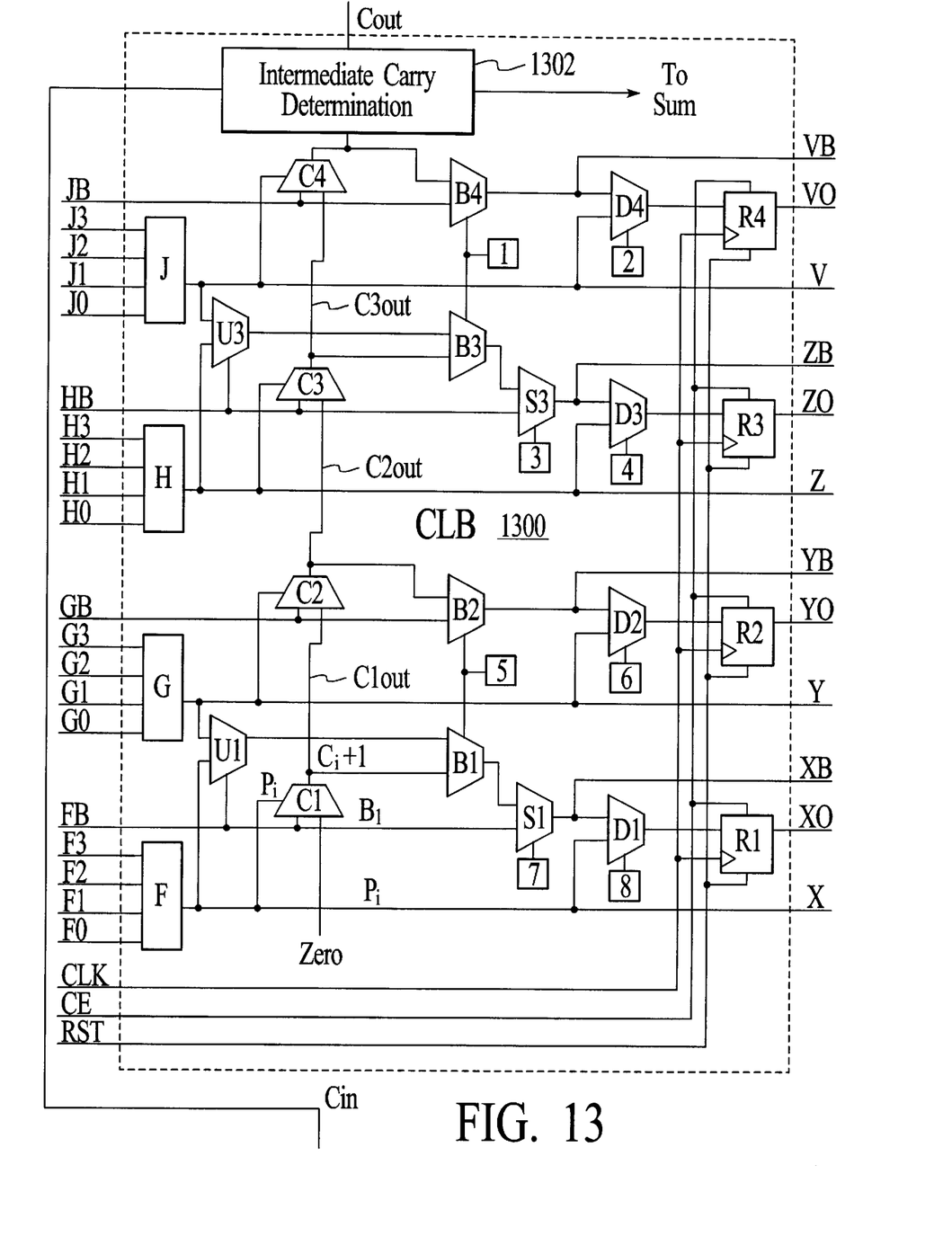
FIG. 13 illustrates how a CLB in a conventional programmable logic device can be modified to implement the carry lookahead scheme of the present invention.

FIG. 13 illustrates a CLB 1300 that has been modified in accordance with this example of the invention. As shown in FIG. 13, the carry mux C1 of the lowest order bit of CLB 1300 receives a zero input rather than the carry input of the previous CLB, and the resultant carry for the CLB is combined with the received carry input in intermediate carry determination block 1302. Carry determination block 1302 includes logic for providing the true carry COUT based on the received carry input CIN and the resultant carry for the CLB. This true carry is also provided to the sum output stage (typically an adjacent CLB) for use in determining the sum output for each bit, thus correcting the assumption that the received carry is zero if necessary. The actual logic included in carry determination block 1302 (and in the adjacent CLB or additional logic for implementing the sum output stage) is considered an implementation detail that becomes apparent to those skilled in the art after being taught by the present specification. Moreover, it should be apparent that further configuration switches may need to be added to implement this modified carry propagation scheme. However, the interconnections for propagating carry signals CIN and COUT between CLBs can remain unchanged.

Although the present invention is useful in conventionally available programmable logic devices, even further advantages are obtained when the inventive carry propagation techniques are implemented using the programmable logic array structures disclosed in U.S. patent application No. 09/475,400, filed Dec. 30, 1999, commonly owned by the assignee of the present invention, the contents of which are incorporated herein by reference (hereinafter referred to "the MSA application").

Figure 14:
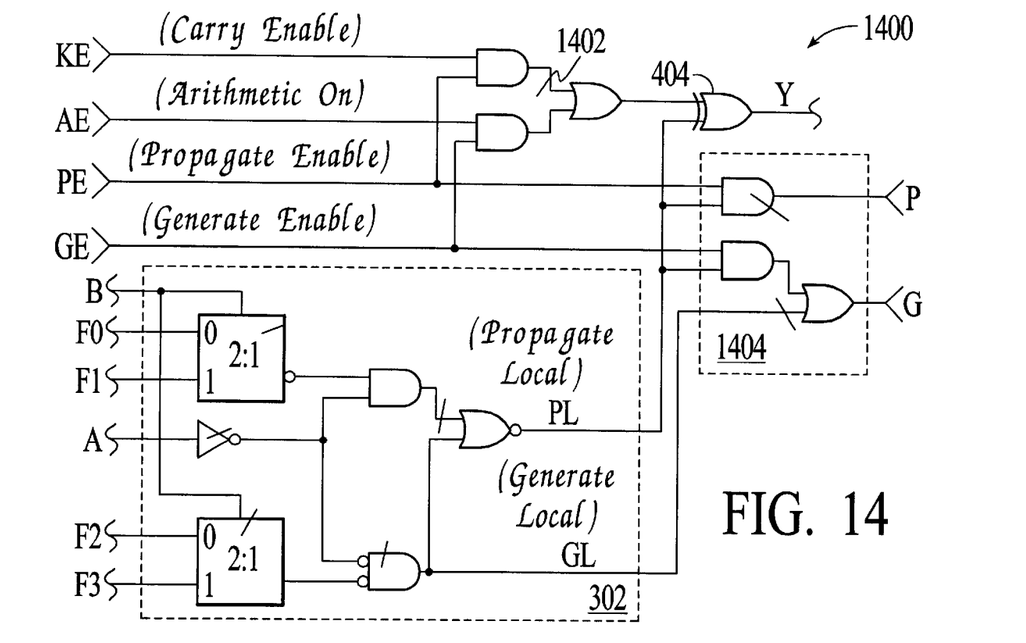
FIG. 14 illustrates a function cell such as that disclosed in co-pending U.S. patent application No. 09/475,400 that is modified to implement the carry lookahead scheme of the present invention.

In particular, FIG. 14 illustrates a function cell 1400 such as that illustrated in FIG. 9 of the MSA application that has been modified in accordance with the present invention. As shown in FIG. 14, in addition to the structure associated with function cell 302, cell 1400 includes elements of both ALU block 1202 and increment adjustment block 1204 associated with a single bit operation. In particular, logic 1402 (as does the K block in increment adjustment block 1204) computes the carry for the bit based on received carry signals and (perhaps) propagate and generate signals from a less significant bit. Likewise, logic 1404 implements the functionality associated with PK blocks in ALU block 1202 for providing a ripple combination of the local propagate and generate signals with (perhaps) propagate and generate signals from a less significant bit.

Figure 15:
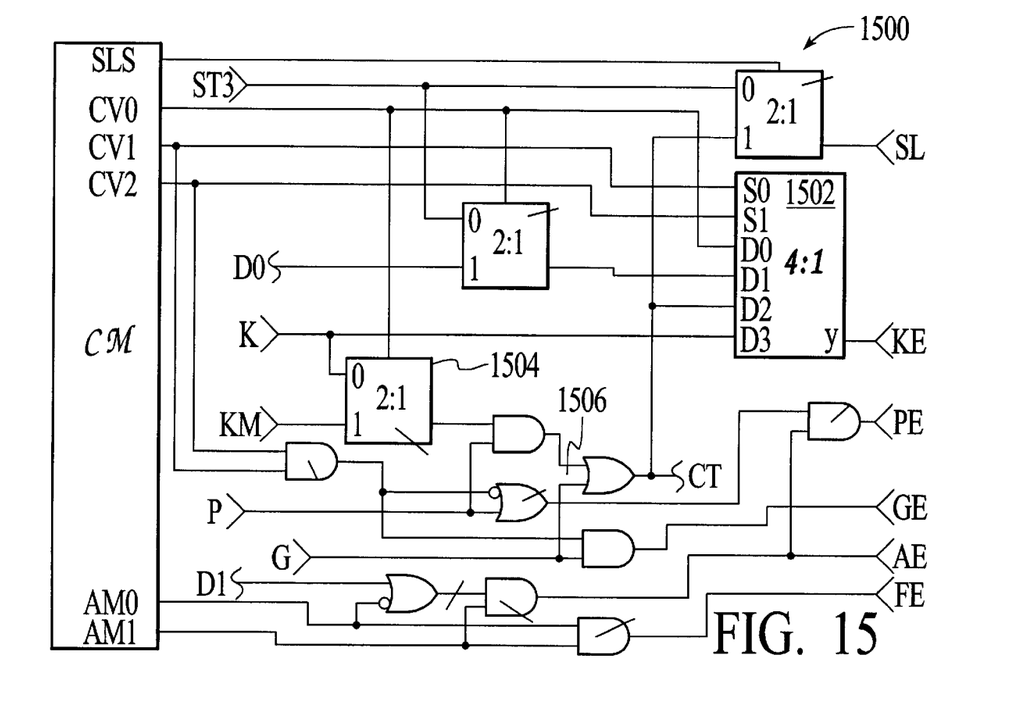
FIG. 15 illustrates an arithmetic mode controller such as that disclosed in co-pending U.S. patent application No. 09/475,400 that is modified to implement the carry lookahead scheme of the present invention.

For implementing the additional K block that is needed to compute the intermediate carries as in intermediate carry block 1206, FIG. 15 illustrates a modified arithmetic mode controller 1500 based on that illustrated in FIG. 20 of the MSA application that is included in an ALU controller for each ALU block, as described in that application. In effect, the functionality of intermediate carry block 1206 is split between the ALU controllers for each ALU block of the MSA application. Arithmetic mode controller 1500 can be used in conjunction with a plurality of function cells such as 1400 for implementing an ALU such as that illustrated in FIG. 12. The arrangement and interconnection of cells 1400 and controller 1500 will be understood with reference to the MSA application and the present specification.

As shown in FIG. 15, logic 1506 effectively performs the function of a K block in intermediate carry block 1206. The signal K is the received carry from a less significant stage in the carry chain, which is combined with the P and G outputs received from the most significant function cell 1400. The KE signal output from multiplexer 1502 based on the computed carry and configuration bits set in configuration memory is passed onto the ALU controller of the next ALU block associated with the next most significant bits. The PE and GE signals are then used to correct provisional carries for computing the sum Y of each function cell 1400 for the bits associated with this ALU block and ALU controller.

FIG. 15 also illustrates how the number of bits per PK chain can be dynamically adjusted between four and eight bits, for example. In particular, multiplexer 1504 and signal KM can determine whether or not to continue a PK chain. If the chain is not continued, the number of bits is four, otherwise the number of bits is eight.

Table 1 summarizes the comparison of the different types of the carry chain structures for ALU chains having N-bit inputs. For each structure type, the "T" column indicates the number of time units of delay for the worst case traversal of the K and PK blocks of the structure (the total number of which are included in the structure being represented under the column labeled "PK"). As can be seen, the basic structure (herein referred to as "MSA") based on 4-bit ALU blocks is equivalent in cost and performance to a pyramid Carry Lookahead structure for word sizes up to 24-bits. For larger values of N, additional programming may be added to the MSA to improve the performance for very large arithmetic processors. This is shown in the column labeled

TABLE 1

Carry Lookahead Structure Comparison

| Ripple (FIG. 4) | | Min Tree (FIG. 6) | | Pyramid (FIG. 8) | | MSA4 (FIG. 12) | | MSA n | |
|---|---|---|---|---|---|---|---|---|---|
| N | T | PK | T | PK | T | PK | T | PK | T | PK |
| 4 | 4 | | 4 | 3 | 5 | 3 | 7 | 4 | 7 | 4 | 7 |
| 8 | 8 | | 8 | 4 | 13 | 5 | 15 | 5 | 14 | 5 | 14 |
| 12 | 12 | | 12 | 5 | 23 | 7 | 22 | 6 | 21 | 6 | 21 |
| 16 | 16 | | 16 | 5 | 33 | 7 | 30 | 7 | 28 | 7 | 28 |
| 24 | 24 | | 24 | 6 | 61 | 9 | 45 | 9 | 42 | 9 | 42 |
| 32 | 32 | | 32 | 6 | 81 | 9 | 63 | 11 | 56 | 11 | 56 |
| 48 | 48 | | 48 | 7 | 145 | 11 | 92 | 15 | 84 | 13 | 96 |
| 64 | 64 | | 64 | 7 | 193 | 11 | 124 | 19 | 112 | 15 | 128 |

"MSA n".

In the general case, the worst case carry propagation time for an MSA style structure is given by the equation:

$$T = (M-1)T_f + (N/M)T_q \quad \text{(Eq. 11)}$$

Where $T_f$ is the propagation delay for the P and G signal in each bit slice (function cell), $T_q$ is the propagation delay of the intermediate carry signal from the ALU controller (one quad cell time), N is the total number of bits and M is the number of bits in an ALU block.

The optimal value of M to minimize the total time is given by the equation:

$$M^* = \sqrt{N\left(\frac{T_q}{T_f}\right)} \quad \text{(Eq. 12)}$$

For this value, the worst case delay time is given by the equation:

$$T^* = 2\sqrt{N \cdot T_f \cdot T_q} - T_f \quad \text{(Eq. 13)}$$

Although the present invention has been described in detail with reference to the preferred embodiments thereof, those skilled in the art will appreciate that various substitutions and modifications can be made to the examples described herein while remaining within the spirit and scope of the invention as defined in the appended claims.

What is claimed is:

1. A programmable logic device, comprising:

a plurality N of function cells, each function cell being adapted to provide a respective bit result of an N-bit operation, the N function cells being arranged in blocks of respective sub-pluralities of function cells per block; and an intermediate carry calculator associated with at least one block, the intermediate carry calculator calculating an intermediate carry result for the at least one block based on a carry input received from another block associated with less significant bits in the N-bit operation, and signals corresponding to the bit result of the function cell associated with the most significant bit of the at least one block, wherein the intermediate carry calculator implements an equation of the form $$C_{out} = G_N + (P_N * [G_{N-1} + (P_{N-1} * [G_{N-2} + (P_{N-2} * \ldots * [G_2 + (P_2 * [G_1 + (P_1 * C_{in})])] \ldots)])]),$$

wherein the + symbol represents a logical OR operator; and the * symbol represents a logical AND operator; and $C_{out}$ is the intermediate carry result of the N-bit operation; and $C_{in}$ is the carry input for the N-bit operation; and $P_j$ is a propagate output for the j-th function cell of the N-bit operation; and $G_j$ is a generate output for the j-th function cell of the N-bit operation; and j is an integer whose value is from one (1) to N.

2. A programmable logic device according to claim 1, wherein the signals are a combination of a propagate (P) and a generate (G) output from each function cell in the at least one block.

3. A programmable logic device according to claim 2, wherein the intermediate carry calculator implements an equation of the form $$C_{out} = G(OR)(C_{in}(AND)P),$$

wherein $C_{out}$ is the intermediate carry result, and $C_{in}$ is the received carry input.

4. A programmable logic device according to claim 1, further comprising a multiplexer that dynamically controls the number of function cells per block.

5. A programmable logic device according to claim 1, wherein the intermediate carry calculator is operative such that a delay between a change in the received carry input and a change in the intermediate carry result is substantially a propagation time of the intermediate carry calculator.

6. A programmable device according to claim 1, further comprising an increment adjustment block that adjusts a provisional carry associated with the bit result of the function cells in accordance with an actual carry input for the respective blocks in which the function cells are arranged.

7. A programmable device according to claim 2, wherein each function cell implements a bit slice of a '74181 type ALU for generating the P and G outputs based on two single bit variable inputs and a received function code.

8. A programmable device according to claim 7, wherein the P and G outputs are combined in ripple fashion to provide the signals.

9. A method of implementing carry propagation in a programmable logic device, comprising:

identifying N function cells for respectively providing a bit result of an N-bit operation;

dividing the N function cells into blocks of respective sub-pluralities of function cells per block;

calculating an intermediate carry result in at least one block based on a carry input received from another block associated with less significant bits in the N-bit operation, and signals corresponding to the bit result of the function cell associated with the most significant bit of the at least one block, wherein the calculating step implements an equation of the form $$C_{out}=G_N+(P_N{}^*[G_{N-1}+(P_{N-1}{}^*[G_{N-2}+(P_{N-2}{}^* \ldots {}^*[G_2+(P_2{}^*[G_1+(P_1{}^*C_{in})])] \ldots )])]),$$

wherein the + symbol represents a logical OR operator; and the * symbol represents a logical AND operator; and $C_{out}$ is the intermediate carry result of the N-bit operation; and $C_{in}$ is the carry input for the N-bit operation; and $P_j$ is a propagate output for the j-th function cell of the N-bit operation; and $G_j$ is a generate output for the j-th function cell of the N-bit operation; and j is an integer whose value is from one (1) to N.

10. A method according to claim 9, further comprising combining a propagate (P) and a generate (G) output from each function cell to generate the signals in the at least one block.

11. A method according to claim 10, wherein the calculating step implements an equation of the form $$C_{out}=G(OR)(C_{in}(AND)P),$$

wherein $C_{out}$ is the intermediate carry result, and $C_{in}$ is the received carry input.

12. A method according to claim 9, further comprising:

providing a multiplexer that dynamically controls the number of function cells per block.

13. A method according to claim 9, wherein the intermediate carry calculation step is operative such that a delay between a change in the received carry input and a change in the intermediate carry result is substantially a propagation time associated with the intermediate carry calculation step.

14. A method according to claim 9, further comprising:

adjusting a provisional carry associated with the bit result of the function cells in accordance with an actual carry input for the respective blocks in which the function cells are arranged.

15. A method according to claim 10, further comprising:

implementing in each function cell a bit slice of a '74181 type ALU for generating the P and G outputs based on two single bit variable inputs and a received function code.

16. A method according to claim 15, further comprising:

combining the P and G outputs in ripple fashion to provide the signals.

17. A programmable logic device, comprising:

a plurality N of function cells, each function cell being adapted to provide a respective bit result of an N-bit operation, the N function cells being arranged in blocks of respective sub-pluralities of function cells per block; and an intermediate carry calculator associated with at least one block, the intermediate carry calculator calculating an intermediate carry result for the at least one block based on a carry input received from another block associated with less significant bits in the N-bit operation, and signals corresponding to the bit result of the function cell associated with the moss significant bit of the at least one block, wherein the signals are a combination of a propagate (P) and a generate (G) output from each function cell in the at least one block, and wherein the intermediate carry calculator includes a plurality of K blocks and PK blocks, the K blocks calculating a single bit carry output based on a received pair of P and G signals and a carry input, the PK blocks calculating a combined pair of signals representing P, G and carry outputs based on received P, G and carry inputs.

18. A programmable logic device, comprising:

a plurality N of function cells, each function cell being adapted to provide a respective bit result of an N-bit operation, the N function cells being arranged in blocks of respective sub-pluralities of function cells per block; and an intermediate carry calculator associated with at least one block, the intermediate carry calculator calculating an intermediate carry result for the at least one block based on a carry input received from another block associated with less significant bits in the N-bit operation, and signals corresponding to the bit result of the function cell associated with the most significant bit of the at least one block, wherein the signals are a combination of a propagate (P) and a generate (G) output from each function cell in the at least one block, and wherein each function cell implements a bit slice of a '74181 type ALU for generating the P and G outputs based on two single bit variable inputs and a received function code, and wherein the intermediate carry calculator includes a plurality of K blocks and PK blocks, the K blocks calculating a single bit carry output based on a received pair of P and G signals and a carry input, the PK blocks calculating a combined pair of signals representing P, G and carry outputs based on received P, G and carry inputs.

19. A programmable logic device according to claim 18, wherein the function cells, and certain of the K blocks and PK blocks are arranged in N/M sub-blocks of cells each for providing a M-bit output, M-bit P signal, and an M-bit G signal based on a received M-bit input, carry input and the received function code.

20. A programmable logic device according to claim 19, wherein certain other of the K blocks and PK blocks are arranged together in a CLU to form a final carry output based on a received carry input and the M-bit P and G signals.

* * * * *